(12) United States Patent
Yamaguchi et al.

(10) Patent No.: US 11,155,923 B2
(45) Date of Patent: Oct. 26, 2021

(54) GAS SUPPLY DEVICE, GAS SUPPLY METHOD AND FILM FORMING METHOD

(71) Applicant: TOKYO ELECTRON LIMITED, Tokyo (JP)

(72) Inventors: Katsumasa Yamaguchi, Nirasaki (JP); Kensaku Narushima, Nirasaki (JP); Hironori Yagi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 426 days.

(21) Appl. No.: 15/902,124

(22) Filed: Feb. 22, 2018

(65) Prior Publication Data
US 2018/0251898 A1 Sep. 6, 2018

(30) Foreign Application Priority Data
Mar. 2, 2017 (JP) ............... JP2017-039192

(51) Int. Cl.
| | | |
|---|---|---|
| *C23C 16/455* | (2006.01) | |
| *C23C 16/52* | (2006.01) | |
| *C23C 16/06* | (2006.01) | |
| *C23C 16/14* | (2006.01) | |
| *C23C 16/458* | (2006.01) | |
| *C23C 16/448* | (2006.01) | |

(52) U.S. Cl.
CPC .............. *C23C 16/52* (2013.01); *C23C 16/06* (2013.01); *C23C 16/14* (2013.01); *C23C 16/4481* (2013.01); *C23C 16/4586* (2013.01); *C23C 16/45544* (2013.01); *C23C 16/45561* (2013.01)

(58) Field of Classification Search
CPC ......... C23C 16/52; C23C 16/06; C23C 16/14; C23C 16/45544; C23C 16/08

USPC ......................................................... 118/726
See application file for complete search history.

(56) References Cited

U.S. PATENT DOCUMENTS 6,282,368 B1    8/2001  Horie et al.
2002/0067917 A1  6/2002  Takamatsu et al.
(Continued)

FOREIGN PATENT DOCUMENTS

| CN | 101307435 A | 11/2008 |
|---|---|---|
| CN | 106011777 A | 10/2016 |

(Continued)

OTHER PUBLICATIONS

"Physics and Technology of Thin Films," Chen Guoping, Southeast University Press. p. 49-50, May 1993.

*Primary Examiner* — Elizabeth A Burkhart
(74) *Attorney, Agent, or Firm* — Nath, Goldberg & Meyer; Jerald L. Meyer; Tanya E. Harkins

(57) ABSTRACT

There is provided a gas supply device for vaporizing a raw material inside a raw material container and supplying a raw material gas into a processing vessel together with a carrier gas, including: a mass flow controller connected to an upstream side of the raw material container and configured to control a flow rate of the carrier gas; a flow meter connected to a downstream side of the raw material container; and a control part configured to perform a control so as not to supply the raw material gas into the processing vessel until a detection value of the flow meter with respect to the carrier gas controlled to have a constant flow rate by the mass flow controller is stabilized after replacing the raw material container.

4 Claims, 6 Drawing Sheets

(56) References Cited

U.S. PATENT DOCUMENTS

| | | |
|---|---|---|
| 2006/0010909 A1 | 1/2006 | Brigala et al. |
| 2007/0042119 A1 | 2/2007 | Matthysse et al. |
| 2008/0044573 A1 | 2/2008 | Chen et al. |
| 2008/0170984 A1 | 7/2008 | Tenne et al. |
| 2010/0009079 A1 | 1/2010 | Ysmazaki et al. |
| 2011/0100483 A1 | 5/2011 | Nagata et al. |
| 2013/0186332 A1 | 7/2013 | Hirose et al. |
| 2015/0152557 A1* | 6/2015 | Okura ............... C23C 16/45561 427/8 |
| 2015/0322567 A1 | 11/2015 | Hidaka et al. |
| 2016/0071720 A1 | 3/2016 | Nitta et al. |
| 2016/0273101 A1* | 9/2016 | Komori ................... C23C 16/14 |
| 2017/0221731 A1 | 8/2017 | Tanaka et al. |
| 2018/0251898 A1 | 9/2018 | Yamaguchi et al. |

FOREIGN PATENT DOCUMENTS

| | | |
|---|---|---|
| EP | 0498622 A2 | 8/1992 |
| EP | 0905276 A2 | 3/1999 |
| JP | 2016-134569 A | 7/2016 |
| JP | 2016-145409 A | 8/2016 |
| JP | 2016-171244 A | 9/2016 |
| JP | 2016-225396 A | 12/2016 |
| KR | 1020160115781 A | 10/2016 |

\* cited by examiner

FIG. 6

|  | Sample 1 (10h) | Sample 2 (2h) | Sample 3 (0h) |
|---|---|---|---|
| W thickness [nm] | 3.8 | 3.7 | 0.5 |
| W resistivity [μΩcm] | 10.28 | 12.44 | 1.38 |

GAS SUPPLY DEVICE, GAS SUPPLY METHOD AND FILM FORMING METHOD

CROSS-REFERENCE TO RELATED APPLICATION

This application is based upon and claims the benefit of priority from Japanese Patent Application No. 2017-039192, filed on Mar. 2, 2017, the entire contents of which are incorporated herein by reference.

TECHNICAL FIELD

The present disclosure relates to a gas supply device, a gas supply method and a film forming method.

BACKGROUND

When manufacturing an LSI, a tungsten film is widely used for a MOSFET gate electrode, a contact with a source/drain, a word line of a memory and the like.

As a method of forming a tungsten film, a so-called atomic layer deposition (ALD) method in which a tungsten hexachloride ($WCl_6$) gas as a raw material gas and an $H_2$ gas as a reducing gas are alternately supplied, a plurality of times, to a substrate disposed inside a processing vessel. In addition, the $WCl_6$ gas as a raw material gas is generated by sublimating $WCl_6$ which is a solid raw material contained in a film forming raw material tank.

Moreover, in the aforementioned method, when the $WCl_6$ inside the film forming raw material tank becomes small, the film forming raw material tank is replaced. After the replacement of the film forming raw material tank, even if film formation is performed under the process conditions applied before the replacement, there may be a case where the process reproducibility deteriorates, for example, a phenomenon of non-film formation occurs. In addition, when the process reproducibility deteriorates, a standard for obtaining the process reproducibility is not clear.

Thus, in the related art, film formation was repeatedly performed on the wafer until the process reproducibility is obtained or until the film formation result becomes stable. Therefore, there is a problem that a period of time required until the process is resumed after replacing the film forming raw material tank is long and extra wafers are consumed until the process reproducibility is obtained.

SUMMARY

Some embodiments of the present disclosure provide a gas supply device capable of easily supplying a raw material gas in a stable state after replacing a film forming raw material tank.

According to one embodiment of the present disclosure, there is provided a gas supply device for vaporizing a raw material inside a raw material container and supplying a raw material gas into a processing vessel together with a carrier gas, including: a mass flow controller connected to an upstream side of the raw material container and configured to control a flow rate of the carrier gas; a flow meter connected to a downstream side of the raw material container; and a control part configured to perform a control so as not to supply the raw material gas into the processing vessel until a detection value of the flow meter with respect to the carrier gas controlled to have a constant flow rate by the mass flow controller is stabilized after replacing the raw material container.

According to another embodiment of the present disclosure, there is provided a gas supply method for vaporizing a raw material inside a raw material container and supplying a raw material gas into a processing vessel together with a carrier gas, including: performing a control so as not to supply the raw material gas into the processing vessel until a detection value of a flow meter connected to a downstream side of the raw material container, with respect to the carrier gas controlled to have a constant flow rate by a mass flow controller connected to an upstream side of the raw material container, is stabilized after replacing the raw material container.

According to another embodiment of the present disclosure, there is provided a film forming method for forming a metal film by repeating a step of vaporizing a raw material inside a raw material container and supplying a raw material gas into a processing vessel together with a carrier gas, and a step of supplying a reducing gas for reducing the raw material gas into the processing vessel, including: an initial stabilization process of determining whether a detection value of a flow meter connected to a downstream side of the raw material container, with respect to the carrier gas controlled to have a constant flow rate by a mass flow controller connected to an upstream side of the raw material container, is stabilized after replacing the raw material container; and a film forming process of forming the metal film by supplying the raw material gas into the processing vessel after it is determined in the initial stabilization step that the detection value of the flow meter is stabilized.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a view showing the film thickness and resistivity of a tungsten film.

DETAILED DESCRIPTION

Figure 1:
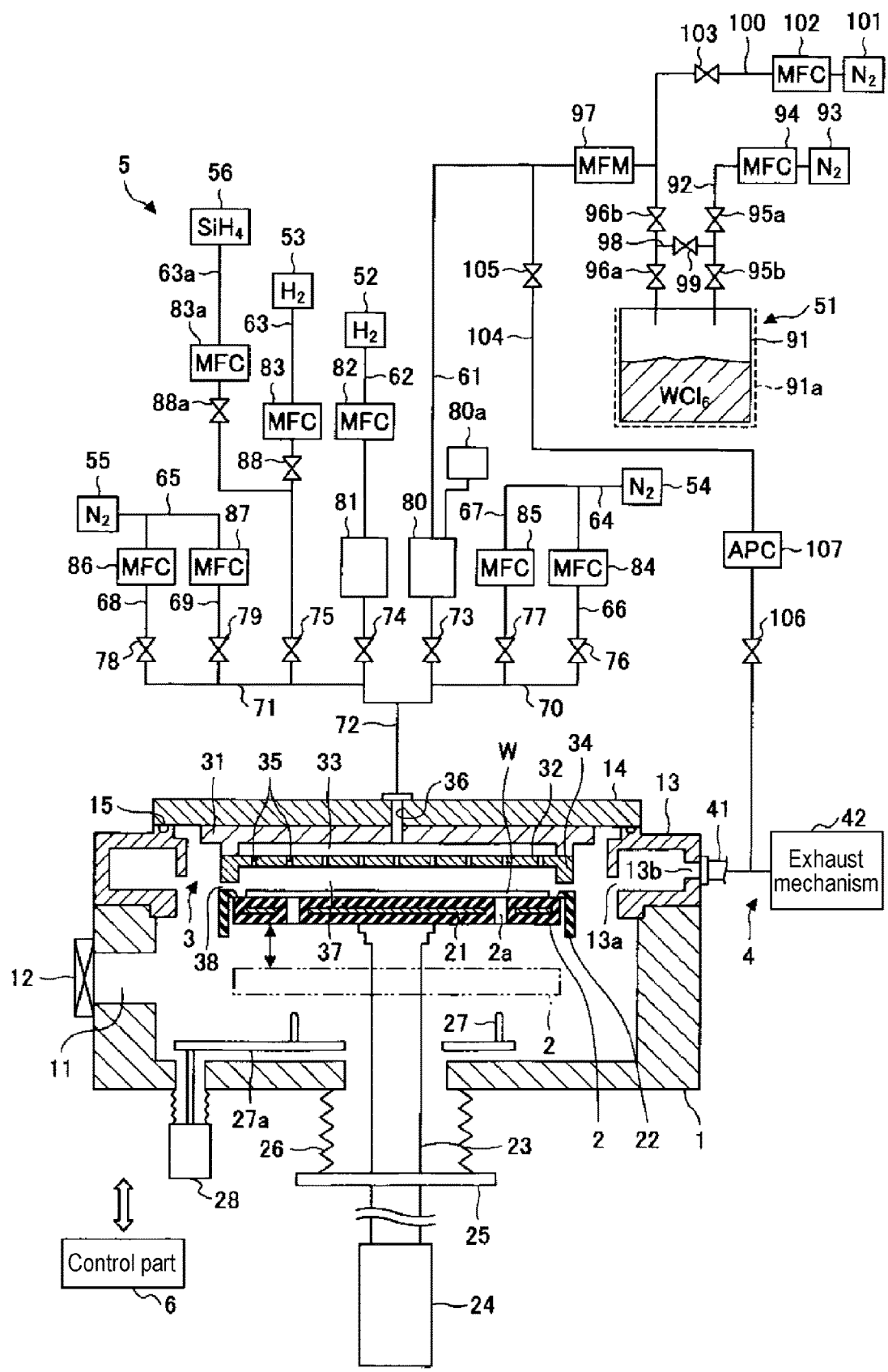
FIG. 1 is a schematic sectional view showing an example of a film forming apparatus provided with a gas supply device according to the present embodiment.

Hereinafter, a mode for carrying out the present disclosure will be described with reference to the drawings. In the specification and the drawings, substantially the same components are denoted by the same reference numerals, and redundant description thereof is omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film Forming Apparatus]

FIG. 1 is a schematic cross sectional view illustrating an example of a film forming apparatus provided with a gas supply device according to an embodiment of the present disclosure. The film forming apparatus according to the present embodiment is configured as an apparatus that can form a film by an atomic layer deposition (ALD) method and a chemical vapor deposition (CVD) method.

The film forming apparatus includes a processing vessel 1, a susceptor 2 for horizontally supporting a semiconductor wafer (hereinafter, simply referred to as a "wafer" W) as a substrate inside the processing vessel 1, a shower head 3 for supplying a processing gas into the processing vessel 1 in the form of a shower, an exhaust part 4 for exhausting the interior of the processing vessel 1, a processing gas supply mechanism 5 for supplying the processing gas to the shower head 3, and a control part 6.

The processing vessel 1 is made of metal such as aluminum, and has a substantially cylindrical shape. A loading/unloading port 11 for loading and unloading the wafer W therethrough is formed in a sidewall of the processing vessel 1. The loading/unloading port 11 is configured to be opened and closed by a gate valve 12. An annular exhaust duct 13 having a rectangular cross section is installed on a main body of the processing vessel 1. A slit 13a is formed along an inner peripheral surface of the exhaust duct 13. In addition, an exhaust port 13b is formed in an outer wall of the exhaust duct 13. A ceiling wall 14 is installed on an upper surface of the exhaust duct 13 so as to close an upper opening of the processing vessel 1. A seal ring 15 is hermetically sealed between the ceiling wall 14 and the exhaust duct 13.

The susceptor 2 has a disk shape having a size corresponding to the wafer W, and is supported by a support member 23. The susceptor 2 is made of a ceramic material such as aluminum nitride (AlN) or a metal material such as an aluminum or nickel-based alloy. A heater 21 for heating the wafer W is embedded in the susceptor 2. The heater 21 generates heat based on power supplied from a heater power source (not shown). The wafer W is controlled to have a prescribed temperature by controlling an output of the heater 21 based on a temperature signal of a thermocouple (not shown) installed around a wafer mounting surface defined in the upper surface of the susceptor 2.

A cover member 22 made of ceramic such as alumina is installed in the susceptor 2 so as to cover an outer peripheral region of the wafer mounting surface and a side surface of the susceptor 2.

The support member 23 supporting the susceptor 2 extends from the center of a bottom surface of the susceptor 2 to a lower side of the processing vessel 1 through a hole portion formed in a bottom wall of the processing vessel 1. A lower end of the support member 23 is connected to an elevating mechanism 24. The susceptor 2 is configured to be moved up and down by the elevating mechanism 24 between a processing position shown in FIG. 1 and a transfer position where the wafer is transferable as indicated by the dashed double-dotted line below the processing position, while being supported by the support member 23. Furthermore, a flange portion 25 is installed in a lower side of the support member 23 below the processing vessel 1. A bellows 26 configured to isolate an internal atmosphere of the processing vessel 1 from ambient air and to be flexible with the vertical movement of the susceptor 2 is installed between the bottom surface of the processing vessel 1 and the flange portion 25.

Three wafer support pins 27 (here, only two are shown) are installed near the bottom surface of the processing vessel 1 so as to protrude upward from an elevating plate 27a. The wafer support pins 27 can be lifted and lowered by an elevating mechanism 28 installed below the processing vessel 1 through the elevating plate 27a. The wafer support pins 27 are inserted into respective through holes 2a installed in the susceptor 2 at the transfer position and can be moved upward and downward on the upper surface of the susceptor 2. By lifting and lowering the wafer support pins 27 in this manner, the wafers W are transferred between the wafer transfer mechanism (not shown) and the susceptor 2.

The shower head 3 is made of metal and is installed so as to face the susceptor 2. The shower head 3 has substantially the same diameter as that of the susceptor 2. The shower head 3 includes a body section 31 fixed to the ceiling wall 14 of the processing vessel 1 and a shower plate 32 installed below the body section 31. A gas diffusion space 33 is formed between the body section 31 and the shower plate 32. A gas introduction hole 36 is formed in the gas diffusion space 33 so as to penetrate the body section 31 and the center of the ceiling wall 14 of the processing vessel 1. An annular projection 34 protruding downward is formed in a peripheral edge portion of the shower plate 32. Gas discharge holes 35 are formed in an inner flat surface of the annular projection 34 of the shower plate 32.

When the susceptor 2 is located at the processing position, a process space 37 is defined between the shower plate 32 and the susceptor 2, and the annular projection 34 and the upper surface of the cover member 22 are brought close to each other to form an annular clearance 38.

The exhaust part 4 includes an exhaust pipe 41 connected to the exhaust port 13b of the exhaust duct 13 and an exhaust mechanism 42 equipped with a vacuum pump, a pressure control valve and the like, and connected to the exhaust pipe 41. During the processing, the gas within the processing vessel 1 reaches the exhaust duct 13 via the slit 13a, and is exhausted from the exhaust duct 13 via the exhaust pipe 41 by the exhaust mechanism 42 of the exhaust part 4.

The processing gas supply mechanism 5 includes a $WCl_6$ gas supply mechanism 51, a first $H_2$ gas supply source 52, a second $H_2$ gas supply source 53, a first $N_2$ gas supply source 54, a second $N_2$ gas supply source 55, and an $SiH_4$ gas supply source 56. The $WCl_6$ gas supply mechanism 51 supplies a $WCl_6$ gas as a metal chloride gas which is a raw material gas. The first $H_2$ gas supply source 52 supplies an $H_2$ gas as a reducing gas. The second $H_2$ gas supply source 53 supplies an $H_2$ gas as an additive reducing gas. The first $N_2$ gas supply source 54 and the second $N_2$ gas supply source 55 supply an $N_2$ gas as a purge gas. The $SiH_4$ gas supply source 56 supplies an $SiH_4$ gas.

In addition, the processing gas supply mechanism 5 includes a $WCl_6$ gas supply line 61, a first $H_2$ gas supply line 62, a second $H_2$ gas supply line 63, a first $N_2$ gas supply line 64, a second $N_2$ gas supply line 65, and an $SiH_4$ gas supply line 63a. The $WCl_6$ gas supply line 61 is a line extending from the $WCl_6$ gas supply mechanism 51. The first $H_2$ gas supply line 62 is a line extending from the first $H_2$ gas supply source 52. The second $H_2$ gas supply line 63 is a line extending from the second $H_2$ gas supply source 53. The first $N_2$ gas supply line 64 is a line which extends from the first $N_2$ gas supply source 54 and supplies the $N_2$ gas to the side of the $WCl_6$ gas supply line 61. The second $N_2$ gas supply line 65 is a line which extends from the second $N_2$ gas supply source 55 and supplies the $N_2$ gas to the side of the first $H_2$ gas supply line 62. The $SiH_4$ gas supply line 63a is a line which extends from the $SiH_4$ gas supply source 56 and is installed to be connected to the second $H_2$ gas supply line 63

The first $N_2$ gas supply line 64 is branched into a first continuous $N_2$ gas supply line 66 through which the $N_2$ gas is supplied at all times during film formation by the ALD method, and a first flash purge line 67 through which the $N_2$ gas is supplied only during a purging step. Furthermore, the second $N_2$ gas supply line 65 is branched into a second continuous $N_2$ gas supply line 68 through which the $N_2$ gas is supplied at all times during the film formation by the ALD method, and a second flash purge line 69 through which the $N_2$ gas is supplied only during the purging step. In addition, the first continuous $N_2$ gas supply line 66 and the first flash purge line 67 are connected to a first connection line 70. The first connection line 70 is connected to the $WCl_6$ gas supply line 61. The second $H_2$ gas supply line 63, the second continuous $N_2$ gas supply line 68, and the second flash purge line 69 are connected to a second connection line 71. The second connection line 71 is connected to the first $H_2$ gas supply line 62. The $WCl_6$ gas supply line 61 and the first $H_2$ gas supply line 62 are joined in a join pipe 72. The join pipe 72 is connected to the aforementioned gas introduction hole 36.

Opening/closing valves 73, 74, 75, 76, 77, 78, and 79 for switching a gas during ALD are installed at the most downstream sides of the $WCl_6$ gas supply line 61, the first $H_2$ gas supply line 62, the second $H_2$ gas supply line 63, the first continuous $N_2$ gas supply line 66, the first flash purge line 67, the second continuous $N_2$ gas supply line 68, and the second flash purge line 69, respectively. In addition, mass flow controllers 82, 83, 84, 85, 86, and 87 as flow rate controllers are installed at the upstream sides of the respective opening/closing valves of the first $H_2$ gas supply line 62, the second $H_2$ gas supply line 63, the first continuous $N_2$ gas supply line 66, the first flash purge line 67, the second continuous $N_2$ gas supply line 68, and the second flash purge line 69, respectively. The mass flow controller 83 is installed at an upstream side of the second $H_2$ gas supply line 63 toward a joint where the $SiH_4$ gas supply line 63a is connected to the second $H_2$ gas supply line 63. An opening/closing valve 88 is installed between the mass flow controller 83 and the joint. Furthermore, a mass flow controller 83a and an opening/closing valve 88a are installed in the $SiH_4$ gas supply line 63a sequentially from the upstream side. Thus, either or both of the $H_2$ gas and the $SiH_4$ gas can be supplied via the second $H_2$ gas supply line 63. Buffer tanks 80 and 81 are respectively installed in the $WCl_6$ gas supply line 61 and the first $H_2$ gas supply line 62 so that an appropriate gas can be supplied in a short period of time. A manometer 80a configured to detect an internal pressure of the buffer tank 80 is installed in the buffer tank 80.

The $WCl_6$ gas supply mechanism 51 includes a film-forming raw material tank 91 as a raw material vessel for storing $WCl_6$. $WCl_6$ is a solid raw material that is solid at room temperature. A heater 91a is installed around the film-forming raw material tank 91 so that a film-forming raw material within the film-forming raw material tank 91 is heated to a proper temperature to sublimate $WCl_6$. The aforementioned $WCl_6$ gas supply line 61 is inserted into the film-forming raw material tank 91 from above.

In addition, the $WCl_6$ gas supply mechanism 51 includes a carrier gas pipe 92 inserted into the film-forming raw material tank 91 from above, a carrier $N_2$ gas supply source 93 for supplying the $N_2$ gas as a carrier gas to the carrier gas pipe 92, a mass flow controller 94 as a flow rate controller connected to the carrier gas pipe 92, opening/closing valves 95a and 95b installed at the downstream side of the mass flow controller 94, and opening/closing valves 96a and 96b and a flowmeter 97 installed near the film-forming raw material tank 91 in the $WCl_6$ gas supply line 61. In the carrier gas pipe 92, the opening/closing valve 95a is installed at a position directly below the mass flow controller 94, and the opening/closing valve 95b is installed at an insertion end side of the carrier gas pipe 92. Furthermore, the opening/closing valves 96a and 96b and the flowmeter 97 are arranged in the named order from the insertion end of the $WCl_6$ gas supply line 61.

A bypass pipe 98 is installed so as to connect a position between the opening/closing valve 95a and the opening/closing valve 95b of the carrier gas pipe 92 and a position between the opening/closing valve 96a and the opening/closing valve 96b of the $WCl_6$ gas supply line 61. An opening/closing valve 99 is installed in the bypass pipe 98. By closing the opening/closing valves 95b and 96a and opening the opening/closing valves 99, 95a and 96b, the $N_2$ gas supplied from the carrier $N_2$ gas supply source 93 is supplied to the $WCl_6$ gas supply line 61 through the carrier gas pipe 92 and the bypass pipe 98. Thus, the $WCl_6$ gas supply line 61 can be purged.

Furthermore, an end portion at the downstream side of a dilution $N_2$ gas supply line 100 for supplying the $N_2$ gas as a dilution gas joins the upstream side of the flowmeter 97 in the $WCl_6$ gas supply line 61. A dilution $N_2$ gas supply source 101 serving as a supply source of the $N_2$ gas is installed at an end portion at the upstream side of the dilution $N_2$ gas supply line 100. A mass flow controller 102 and an opening/closing valve 103 are installed in the dilution $N_2$ gas supply line 100 from the corresponding upstream side.

One end of an EVAC line 104 is connected to a downstream position of the flowmeter 97 in the $WCl_6$ gas supply line 61, and the other end of the EVAC line 104 is connected to the exhaust pipe 41. An opening/closing valve 105 and an opening/closing valve 106 are installed at a position near the $WCl_6$ gas supply line 61 in the EVAC line 104 and at a position near the exhaust pipe 41, respectively. A pressure control valve 107 is also installed between the opening/closing valve 105 and the opening/closing valve 106. Then, the interior of the film-forming raw material tank 91 and the interior of the buffer tank 80 can be exhausted by the exhaust mechanism 42 by opening the opening/closing valves 105, 106, 96a and 96b while closing the opening/closing valves 99, 95a, and 96b.

The control part 6 includes a process controller equipped with a microprocessor (computer) that controls the respective components, specifically the valves, the power supplies, the heater, the pump and the like, a user interface, and a storage part. Each component of the film forming apparatus is electrically connected to the process controller so as to be controlled. The user interface is connected to the process controller, and includes a keyboard that causes an operator to execute input operations of commands in order to manage each component of the film forming apparatus, a display that visually displays an operation status of each component of the film forming apparatus, and the like. The storage part is also connected to the process controller. The storage part stores a control program for realizing various processes to be executed by the film forming apparatus under the control of the process controller, a control program that causes each component of the film forming apparatus to execute a predetermined process according to the processing conditions, namely a process recipe, various databases, or the like.

The process recipe is stored in a storage medium (not shown) in the storage part. The storage medium may be one that is fixedly installed such as a hard disk, or one that is portable such as a CDROM, a DVD, or a semiconductor memory. Also, the recipe may be appropriately transmitted from another device, for example, via a dedicated line. If necessary, a predetermined process recipe may be called from the storage part according to an instruction provided from the user interface and then executed by the process controller so that a desired process is performed in the film forming apparatus under the control of the process controller.

[Gas Supply Method]

A gas supply method according to the present embodiment will be described by taking, as an example, a case (film forming method) in which a tungsten film is formed using the above-described film forming apparatus. The gas supply method according to the present embodiment includes an initial stabilization step of a film forming raw material performed after the replacement of the film forming raw material tank 91 and before film formation on the wafer W, and a film forming step performed after the initial stabilization step of the film forming raw material.

(Initial Stabilization Step of Film Forming Raw Material)

Figure 2:
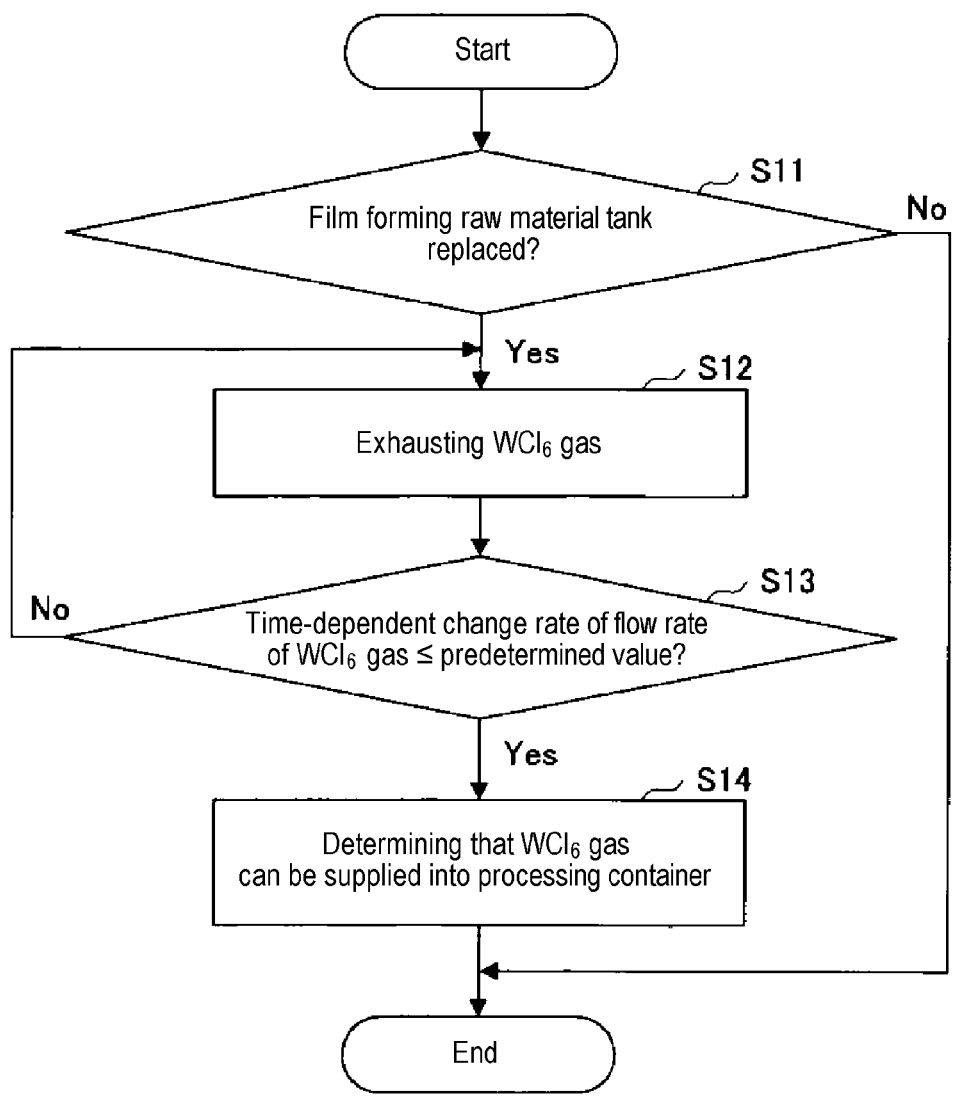
FIG. 2 is a flowchart showing an initial stabilization step of a film forming raw material according to the present embodiment.

The initial stabilization step of the film forming raw material will be described. FIG. 2 is a flowchart showing the initial stabilization step of the film forming raw material according to the present embodiment.

First, the control part 6 determines whether or not the film forming raw material tank 91 is replaced (step S11).

If it is determined in step S11 that the film forming raw material tank 91 is not replaced, the process is terminated.

If it is determined in step S11 that the film forming raw material tank 91 is replaced, the control part 6 controls the opening closing valve so as to exhaust the $WCl_6$ gas generated in the film forming raw material tank 91 (step S12). Specifically, the control part 6 opens the opening/closing valves 95a, 95b, 96a, 96b, 103, 105 and 106 in a state in which the opening/closing valves 99 and 73 are closed. As a result, the $N_2$ gas supplied from the carrier $N_2$ gas supply source 93, the $WCl_6$ gas generated in the film forming raw material tank 91 and the $N_2$ gas supplied from the dilution $N_2$ gas supply source 101 are exhausted via the EVAC line 104 by the exhaust mechanism 42. Therefore, the $N_2$ gas containing the $WCl_6$ gas is not supplied into the processing vessel 1. The control part 6 controls the mass flow controllers 94 and 102 so that the flow rate of the $N_2$ gas supplied from the carrier $N_2$ gas supply source 93 and the flow rate of the $N_2$ gas supplied from the dilution $N_2$ gas supply source 101 become a constant flow rate.

Subsequently, the control part 6 determines whether the time-dependent change rate of the flow rate of the $WCl_6$ gas is equal to or smaller than a threshold value (step S13). The flow rate F (mg/min) of the $WCl_6$ gas is a value calculated by the following equation (1), assuming that the flow rate of the $WCl_6$ gas in terms of the $N_2$ gas is F0 (sccm) and the molecular weight of $WCl_6$ is M.

$$F = F0 \times C.F. / 22400 \times M \times 1000 \quad (1)$$

F0 is calculated by the following equation (2), assuming that the detection value of the flow meter 97 in one cycle time (sec) is F1 (scc), the detection value of the flow rate of the mass flow controller 94 is F2 (scc), and the detection value of the flow rate of the mass flow controller 102 is F3 (scc).

$$F0 = \{F1 - (F2 + F3)\} / \text{one cycle time} \times 60 \quad (2)$$

Furthermore, C. F. is a conversion factor (constant), which is 0.2 in the present embodiment. In addition, the molecular weight M of $WCl_6$ is 396.56. The threshold value is, for example, 13 mg/min.

If it is determined in step S13 that the time-dependent change rate of the flow rate of the $WCl_6$ gas is larger than the threshold value, the control part 6 determines that the detection value of the flow meter 97 is not stable, and returns to step S12. That is to say, the $N_2$ gas containing the $WCl_6$ gas is continuously exhausted by the exhaust mechanism 42 via the EVAC line 104.

If it is determined in step S13 that the time-dependent change rate of the flow rate of the $WCl_6$ gas is equal to or smaller than the threshold value, the control part 6 determines that the detection value of the flow meter 97 is stable and the $N_2$ gas containing the $WCl_6$ gas can be supplied into the processing vessel 1 (step S14). Then, the control part 6 closes the opening/closing valves 105 and 106, thereby stopping the exhaust of the $N_2$ gas containing the $WCl_6$ gas via the EVAC line 104.

(Film Forming Step)

The film forming step will now be described. The film forming step is executed when the control part 6 determines in the initial stabilization step of the film forming raw material that the $N_2$ gas containing the $WCl_6$ gas can be supplied into the processing vessel 1.

Figure 3:
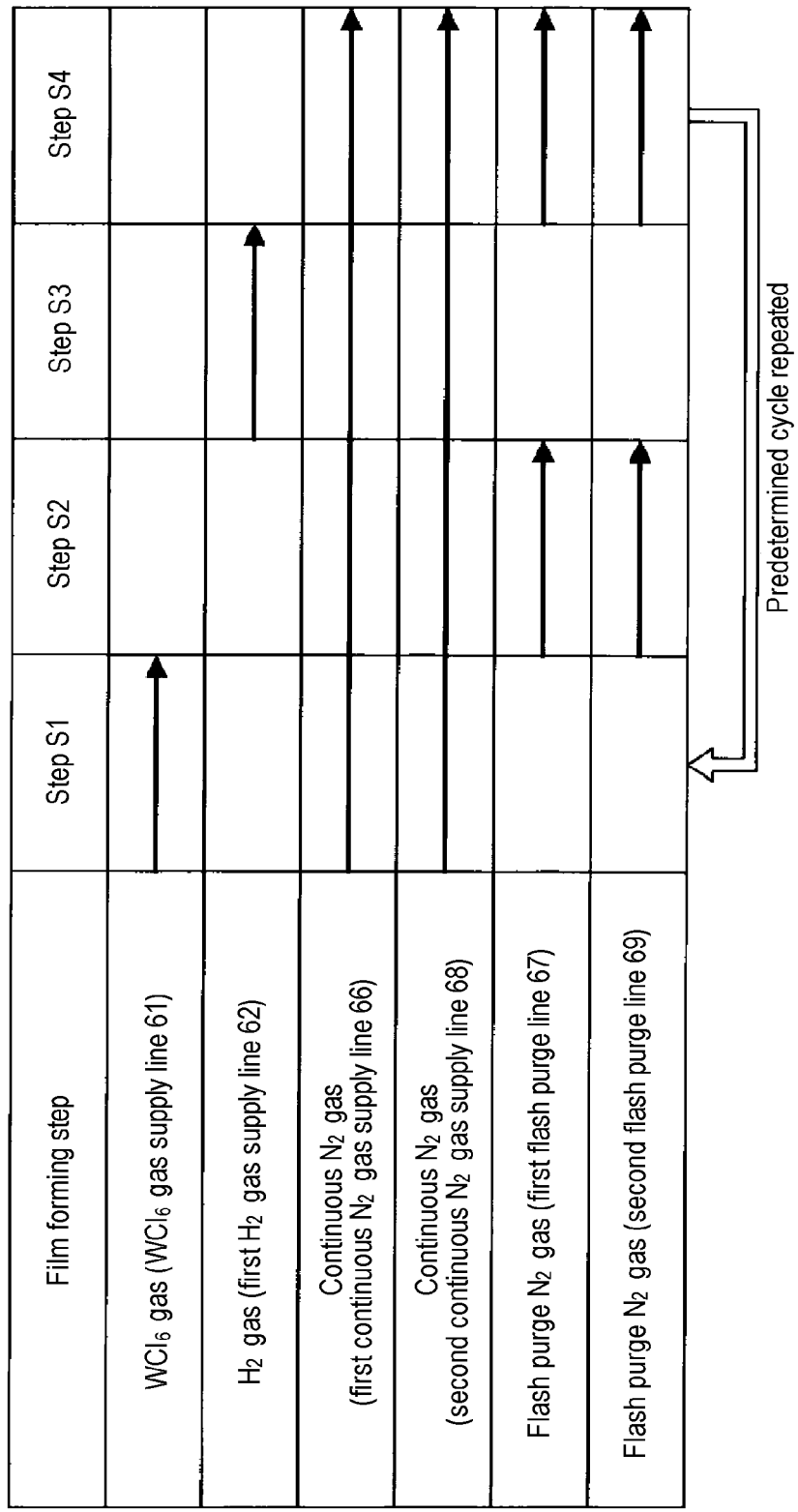
FIG. 3 is a view showing a gas supply sequence in a film forming step according to the present embodiment.

FIG. 3 is a view showing a gas supply sequence in the film forming step according to the present embodiment.

Step S1 is a raw material gas supply step of supplying a $WCl_6$ gas to the process space 37. In step S1, first, an $N_2$ gas is continuously supplied from the first $N_2$ gas supply source 54 and the second $N_2$ gas supply source 55 via the first continuous $N_2$ gas supply line 66 and the second continuous $N_2$ gas supply line 68 while opening the opening/closing valves 76 and 78. Furthermore, by opening the opening/closing valve 73, the $WCl_6$ gas is supplied from the $WCl_6$ gas supply mechanism 51 to the process space 37 in the processing vessel 1 via the $WCl_6$ gas supply line 61. At this time, the $WCl_6$ gas is temporarily stored in the buffer tank 80 and then supplied into the processing vessel 1. Also, in step S1, an $H_2$ gas may be supplied as an additive reducing gas into the processing vessel 1 via the second $H_2$ gas supply line 63 extending from the second $H_2$ gas supply source 53. By supplying the reducing gas together with the $WCl_6$ gas in step S1, the supplied $WCl_6$ gas is activated so that the film forming reaction in a subsequent step S3 is likely to occur. Therefore, it is possible to maintain high step coverage, and to increase a deposition rate by increasing a deposition film thickness per cycle. A flow rate of the additive reducing gas may be set at a flow rate to such an extent that the CVD reaction does not occur in step S1.

Step S2 is a purging step of purging an excess $WCl_6$ gas or the like in the process space 37. In step S2, the opening/closing valve 73 is closed to stop the supply of the $WCl_6$ gas while continuing to supply the $N_2$ gas via the first continuous $N_2$ gas supply line 66 and the second continuous $N_2$ gas supply line 68. Furthermore, the opening/closing valves 77 and 79 are opened, and the $N_2$ gas (flash purge $N_2$ gas) is also supplied from the first flash purge line 67 and the second flash purge line 69 so that the excess $WCl_6$ gas or the like in the process space 37 is purged by a large flow rate of the $N_2$ gas.

Step S3 is a reducing gas supply step of supplying an $H_2$ gas to the process space 37. In step S3, the opening/closing valves 77 and 79 are closed to stop the supply of the $N_2$ gas from the first flash purge line 67 and the second flash purge line 69. Furthermore, the opening/closing valve 74 is opened while continuing to supply the $N_2$ gas via the first continuous $N_2$ gas supply line 66 and the second continuous $N_2$ gas supply line 68. Thus, the $H_2$ gas is supplied as a reducing gas from the first $H_2$ gas supply source 52 to the process space 37 via the first $H_2$ gas supply line 62. At this time, the $H_2$ gas is temporarily stored in the buffer tank 81 and then supplied into the processing vessel 1. $WCl_6$ adsorbed onto the wafer W is reduced by step S3. A flow rate of the $H_2$ gas at this time may be set at a flow rate sufficient for the reduction reaction to occur.

Step S4 is a purging step of purging an excess $H_2$ gas in the process space 37. In step S4, the opening/closing valve 74 is closed to stop the supply of the $H_2$ gas from the first $H_2$ gas supply line 62 while continuing to supply the $N_2$ gas via the first continuous $N_2$ gas supply line 66 and the second continuous $N_2$ gas supply line 68. Furthermore, the opening/closing valves 77 and 79 are opened and the $N_2$ gas (flash purge $N_2$ gas) is also supplied from the first flash purge line 67 and the second flash purge line 69 so that, similar to step S2, the excess $H_2$ gas in the process space 37 is purged by a large flow rate of the $N_2$ gas.

The above steps S1 to S4 are carried out one cycle in a short period of time to form a thin tungsten unit film. The cycle of these steps is repeated a plurality of times to form a thin tungsten film of a desired film thickness. The film thickness of the tungsten film at this time may be controlled by the number of repetitions of the cycle.

Incidentally, in the present embodiment, the initial stabilization step of $WCl_6$ as a film forming raw material is performed after the replacement of the film forming raw material tank 91 and before the formation of the tungsten film (film forming step). The reason for this is as follows.

Figure 4:
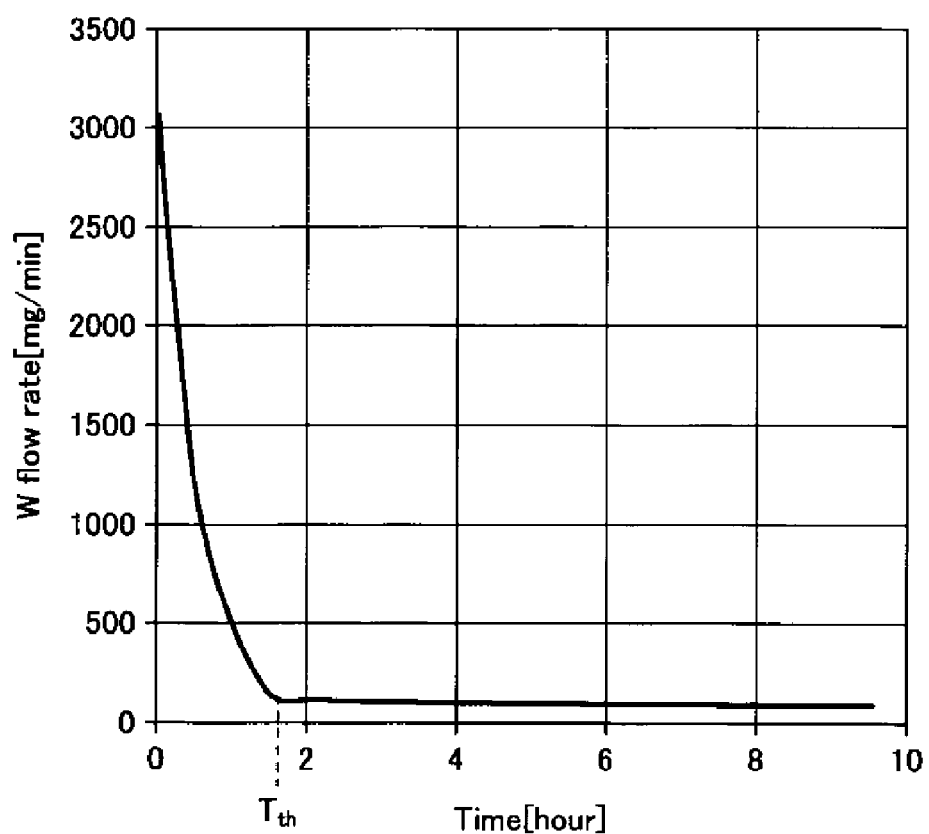
FIG. 4 is a view showing the relationship between an elapsed time after replacement of a film forming raw material tank and a raw material gas flow rate.

FIG. 4 is a view showing the relationship between the elapsed time after the replacement of the film forming raw material tank 91 and the flow rate of the $WCl_6$ gas. In FIG. 4, the horizontal axis represents the elapsed time (hour) after the replacement of the film forming raw material tank 91, and the vertical axis represents the flow rate (mg/min)) of the $WCl_6$ gas.

After the replacement of the film forming raw material tank 91, even if film formation is performed under the process conditions applied before the replacement, there may be a case where the process reproducibility deteriorates, for example, a phenomenon of non-film formation occurs. In addition, when the process reproducibility deteriorates, a standard for obtaining the process reproducibility is not clear. Thus, in the related art, film formation is repeatedly performed on the wafer W until the process reproducibility is obtained or until the film formation result becomes stable. Therefore, there is a problem that a period of time required until the process is resumed after the replacement of the film forming raw material tank 91 is long and extra wafers W are consumed until the process reproducibility is obtained.

Thus, a method for eliminating the deterioration of the process reproducibility which occurs after the replacement of the film forming raw material tank 91 has been studied. As a result, it was found that as shown in FIG. 4, it is effective to form a tungsten film after a time-dependent change rate of a flow rate of a $WCl_6$ gas becomes equal to or smaller than a threshold value after replacing the film forming raw material tank 91. In FIG. 4, the time at which the time-dependent change rate of the flow rate of the $WCl_6$ gas becomes equal to or smaller than the threshold value is indicated by $T_{th}$. In the present embodiment, $T_{th}$ is about 1.8 hours. The reason why it is effective to form the tungsten film after the flow rate of the $WCl_6$ gas becomes equal to or smaller than the threshold value after the replacement of the film forming raw material tank 91 will be described later.

EXAMPLE

In an Example, after replacing the film forming raw material tank 91 in the film forming apparatus shown in FIG. 1, a $WCl_6$ gas was exhausted at a flow rate of 300 mg/min through the EVAC line 104 by the exhaust mechanism 42 for a predetermined period of time. Thereafter, a tungsten film was formed on a wafer W on which a $SiO_2$ film and a TiN film are formed. In addition, the film properties of the tungsten film thus formed were evaluated.

Sample 1 is a sample obtained by exhausting a $WCl_6$ gas for 10 hours and then forming a tungsten film. Sample 2 is a sample obtained by exhausting a $WCl_6$ gas for 2 hours and then forming a tungsten film. Sample 3 is a sample obtained by forming a tungsten film without exhausting a $WCl_6$ gas. The film forming conditions of the tungsten film were the same for all samples (Sample 1, Sample 2 and Sample 3). The film forming conditions of the tungsten film are as follows.

Figure 5A:
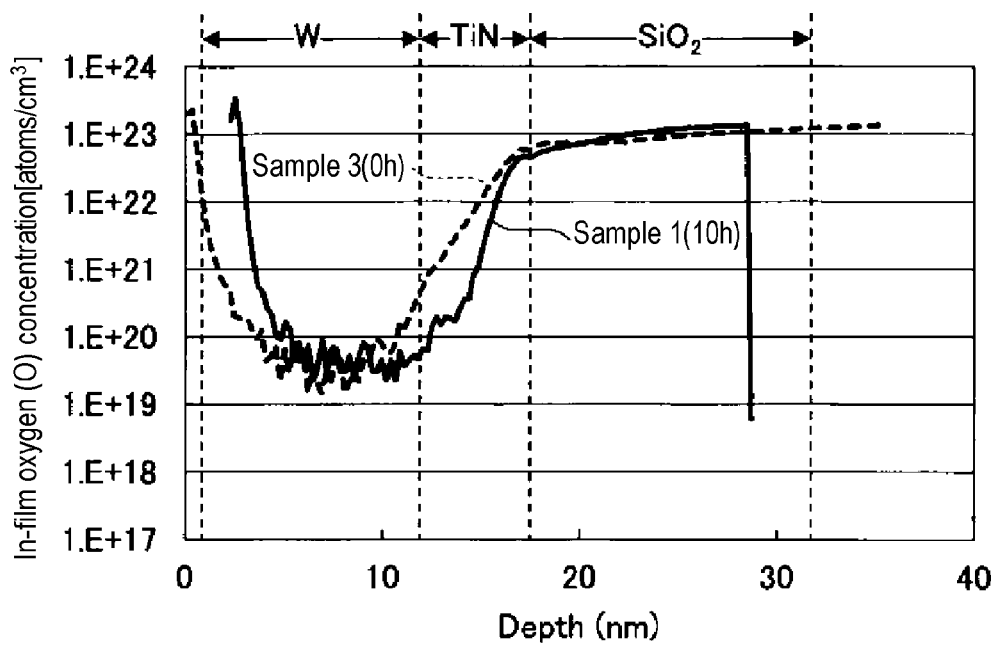
FIGS. 5A and 5B are views showing the measurement results of an in-film impurity concentration of a tungsten film.
Figure 5B:
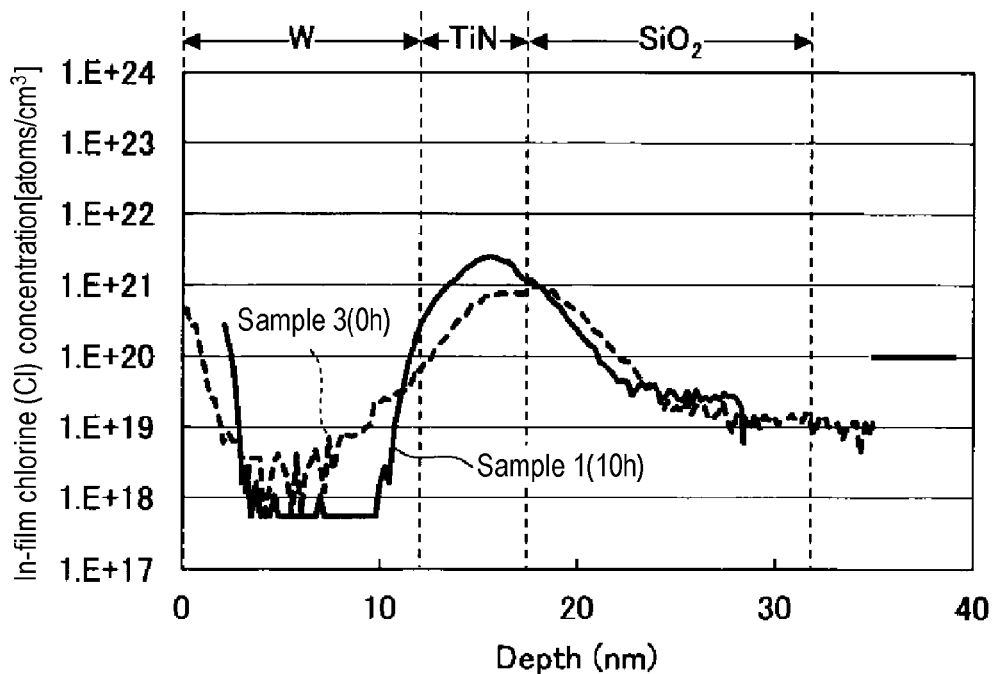

(Film Forming Condition of Tungsten Film)
Wafer temperature: 540 degrees C.
Internal pressure of processing vessel: 30 Torr ($4.0 \times 10^3$ Pa)
Flow rate of $WCl_6$ gas: 300 mg/min
Time period of Step S1: 0.3 seconds
Time period of step S2: 0.3 seconds
Time period of step S3: 0.1 seconds
Time period of step S4: 0.3 seconds
Number of cycles: 900 cycles FIGS. 5A and 5B are views showing the measurement results of an in-film impurity concentration in the tungsten film, which are obtained by a secondary ion mass spectrometry (SIMS). FIG. 5A shows the measurement results of in-film oxygen (O) concentrations of Sample 1 and Sample 3, and FIG. 5B shows the measurement results of in-film chlorine (Cl) concentrations of Sample 1 and Sample 3. In FIG. 5A, the horizontal axis represents the depth (nm) in the stacking direction of the $SiO_2$ film, the TiN film and the tungsten (W) film, and the vertical axis represents the in-film oxygen (O) concentration. In FIG. 5B, the horizontal axis represents the depth (nm) in the stacking direction of the $SiO_2$ film, the TiN film and the tungsten (W) film, and the vertical axis represents the in-film chlorine (Cl) concentration. In FIGS. 5A and 5B, the solid line indicates the measurement result of Sample 1, and the broken line indicates the measurement result of Sample 3.

As shown in FIG. 5A, it can be noted that the in-film O concentration of the tungsten film in Sample 1 is smaller than the in-film O concentration of the tungsten film in Sample 3. This is presumably because, by exhausting the $WCl_6$ gas for 10 hours after the replacement of the film forming raw material tank 91, the oxide formed on the surface of $WCl_6$ as a film forming raw material existing in the replaced film forming raw material tank 91 is restrained from entering the tungsten film.

Furthermore, as shown in FIG. 5B, it can be noted that the in-film Cl concentration of the tungsten film in Sample 1 is smaller than the in-film Cl concentration of the tungsten film in Sample 3. This is presumably because, by exhausting the $WCl_6$ gas for 10 hours after the replacement of the film forming raw material tank 91, the impurity existing on the surface of $WCl_6$ as a film forming raw material in the replaced film forming raw material tank 91 is restrained from entering the tungsten film.

As described above, by exhausting the $WCl_6$ gas for 10 hours after the replacement of the film forming raw material tank 91 and then forming the tungsten film, it is possible to reduce the influence on the film quality of the tungsten film by the replacement of the film forming raw material tank 91.

FIG. 6 is a view showing the film thickness and the resistivity of the tungsten film, and shows the measurement results of the film thickness and the resistivity of the tungsten film in Sample 1, Sample 2 and Sample 3. In FIG. 6, the film thickness (nm) of the tungsten (W) film is shown in the upper stage, and the resistivity ($\mu\Omega$cm) of the tungsten (W) film is shown in the lower stage.

As shown in the upper stage of FIG. 6, the film thickness of the tungsten film in Sample 1 was 3.8 nm, the film thickness of the tungsten film in Sample 2 was 3.7 nm, and the film thickness of the tungsten film in Sample 3 was 0.5 nm. That is to say, it is understood that by exhausting the $WCl_6$ gas for 2 hours or more after the replacement of the film forming raw material tank 91, the film thickness of the tungsten film becomes substantially constant and gets stabilized. This is presumably because, by exhausting the $WCl_6$ gas for 2 hours or more after the replacement of the film forming raw material tank 91, it is possible to suppress the inhibition of formation of the tungsten film by the impurity existing on the surface of $WCl_6$ as a film forming raw material in the replaced film forming raw material tank 91.

As shown in the lower stage of FIG. 6, the resistivity of the tungsten film in Sample 1 was 10.28 $\mu\Omega$cm, the resistivity of the tungsten film in Sample 2 was 12.44 $\mu\Omega$cm, and the resistivity of the tungsten film in Sample 3 was 1.38 $\mu\Omega$cm. That is to say, it is understood that by exhausting the $WCl_6$ gas for 2 hours or more after the replacement of the film forming raw material tank 91, the resistivity of the tungsten film becomes substantially constant and gets stabilized. This is presumably because, by exhausting the $WCl_6$ gas for 2 hours or more after the replacement of the film forming raw material tank 91, the impurity existing on the surface of $WCl_6$ as a film forming raw material in the replaced film forming raw material tank 91 is restrained from entering the tungsten film.

As described above, by exhausting the $WCl_6$ gas for 2 hours or more after the replacement of the film forming raw material tank 91 and then forming the tungsten film, it is possible to reduce the influence on the film quality of the tungsten film by the replacement of the film forming raw material tank 91.

While the mode for carrying out the present disclosure has been described above, the above contents are not intended to limit the scope of the present disclosure. Various modifications and improvements may be made within the scope of the present disclosure.

In the above-described embodiment, the case where the tungsten film is formed using the $WCl_6$ gas as a metal chloride gas has been described as an example. The present disclosure is applicable as long as a metal film is formed by alternately supplying a metal chloride gas and a reduction gas. As the metal chloride gas, other tungsten chloride gases such as a $WCl_5$ gas and the like may be used. Even when the $WCl_5$ gas is used, the $WCl_5$ gas shows substantially the same behavior as the $WCl_6$ gas. When the $WCl_5$ gas is used, $WCl_5$ which is solid at room temperature may be used as a film forming raw material. The present disclosure is applicable to, for example, a case where a molybdenum film is formed using a molybdenum chloride gas and a reducing gas, or a case where a tantalum film is formed using a tantalum chloride gas and a reducing gas. In these cases, molybdenum chloride or tantalum chloride which is solid at room temperature may be used as a film forming raw material. In the above-described embodiment, a solid raw material is sublimed to obtain a raw material gas. Alternatively, a liquid raw material may be vaporized to obtain a raw material gas.

The expression "the raw material gas is not supplied into the processing vessel until the detection value of the flow meter is stabilized" does not merely refer to a state in which the raw material gas is not supplied into the processing vessel, but conceptually means that "the raw material gas is not used as a substrate processing gas until the detection value of the flow meter is stabilized." Therefore, even when the raw material gas is supplied into the processing vessel, if the raw material gas is supplied into the processing vessel until the detection value of the flow meter is stabilized, it is equivalent to a technique in which "the raw material gas is not supplied into the processing vessel until the detection value of the flow meter is stabilized."

Moreover, in the aforementioned embodiment, there has been described a case where the $H_2$ gas is used as the reducing gas as an example. However, any reducing gas may be used so long as it contains hydrogen, and an $SiH_4$ gas, a $B_2H_6$ gas, an $NH_3$ gas, or the like, in addition to the $H_2$ gas, may be used. Two or more of the $H_2$ gas, the $SiH_4$ gas, the $B_2H_6$ gas, and the $NH_3$ gas may be supplied. Also, reducing gases other than these gases, for example, a $PH_3$ gas or an $SiH_2Cl_2$ gas, may be used. From the viewpoint of obtaining a low resistance value by further reducing an impurity in a film, the $H_2$ gas may be used. Also, other inert gases such as an Ar gas may be used as a purge gas and a carrier gas instead of the $N_2$ gas.

In addition to the aforementioned embodiment, there has been described a case where the semiconductor wafer is used as the substrate as an example, but the semiconductor wafer may be a silicon wafer, or may be a compound semiconductor wafer of GaAs, SiC, GaN, and the like. Furthermore, the substrate is not limited to the semiconductor wafer and the present disclosure may be applied to a glass substrate used for a flat panel display (FPD) such as a liquid crystal display device, a ceramic substrate, and the like.

According to the present disclosure in some embodiments, it is possible to easily supply a raw material gas in a stable state after replacing a film forming raw material tank.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas supply device for vaporizing a raw material inside a raw material container and supplying a raw material gas into a processing vessel together with a carrier gas, comprising:
    a mass flow controller connected to an upstream side of the raw material container and configured to control a flow rate of the carrier gas;
    a flow meter connected to a downstream side of the raw material container; and
    a control part configured to perform a control so as not to supply the raw material gas into the processing vessel until a detection value of the flow meter with respect to the carrier gas controlled to have a constant flow rate by the mass flow controller is stabilized after replacing the raw material container, wherein the control part is configured not o perform the control when the raw material container is not replaced, wherein when a time-dependent change rate of the detection value of the flow meter becomes equal to or smaller than a threshold value, the control part determines that the detection value of the flow meter is stabilized, and wherein the detection value of the flow meter is obtained based on a flow rate of the raw material gas in terms of the carrier gas and a molecular weight of the raw material gas.

2. The device of claim 1, wherein the control part is configured to exhaust the processing vessel without supplying the raw material gas into the processing vessel, until the detection value of the flow meter is stabilized.

3. The device of claim 2, further comprising:

an EVAC line having one end connected to a downstream side of the flow meter and the other end connected to an exhaust pipe of the processing vessel, wherein the raw material gas is exhausted via the EVAC line.

4. The device of claim 1, wherein the raw material is a solid raw material of tungsten chloride.

* * * * *

UNITED STATES PATENT AND TRADEMARK OFFICE
CERTIFICATE OF CORRECTION

PATENT NO. : 11,155,923 B2
APPLICATION NO. : 15/902124
DATED : October 26, 2021
INVENTOR(S) : Katsumasa Yamaguchi, Kensaku Narushima and Hironori Yagi It is certified that error appears in the above-identified patent and that said Letters Patent is hereby corrected as shown below:

In the Claims

Claim 1, Column 13, Line 4, please delete the phrase "control part is configured not o perform" and replace with "control part is configured not to perform".

Signed and Sealed this
Fourteenth Day of December, 2021

Drew Hirshfeld
*Performing the Functions and Duties of the*
*Under Secretary of Commerce for Intellectual Property and*
*Director of the United States Patent and Trademark Office*